United States Patent
Wong et al.

[11] Patent Number: 5,329,559
[45] Date of Patent: Jul. 12, 1994

[54] PHASE DETECTOR FOR VERY HIGH FREQUENCY CLOCK AND DATA RECOVERY CIRCUITS

[75] Inventors: Hee Wong; Tsun-Kit Chin, both of San Jose, Calif.

[73] Assignee: National Semiconductor, Santa Clara, Calif.

[21] Appl. No.: 26,266

[22] Filed: Mar. 4, 1993

Related U.S. Application Data

[63] Continuation of Ser. No. 730,228, Jul. 15, 1991, abandoned.

[51] Int. Cl.⁵ .............................................. H03D 3/20
[52] U.S. Cl. .................................. 375/119; 375/120; 307/511; 328/155
[58] Field of Search ........................... 375/81-83, 375/119, 120; 328/109, 111, 133, 134; 329/307, 309, 310; 307/511, 514, 516, 518, 234, 118; 331/1 R, 11-12, 25, 1 A

[56] References Cited

U.S. PATENT DOCUMENTS

| | | | |
|---|---|---|---|
| 4,527,277 | 7/1985 | Kosaka et al. | 328/133 |
| 4,584,695 | 4/1986 | Wong et al. | 375/81 |
| 4,635,277 | 1/1987 | Blake et al. | 375/119 |
| 4,751,469 | 6/1988 | Nakagawa et al. | 328/133 |
| 4,940,948 | 7/1990 | Laws et al. | 329/307 |
| 5,003,562 | 3/1991 | Van Driest et al. | 375/81 |
| 5,117,135 | 5/1992 | Lee et al. | 328/133 |
| 5,126,602 | 6/1992 | Lee et al. | 328/133 |

Primary Examiner—Stephen Chin
Assistant Examiner—Young Tse
Attorney, Agent, or Firm—Flehr, Hohbach, Test, Albritton & Herbert

[57] ABSTRACT

A phase detector circuit, used in a very high frequency phase-locked loop, receives an incoming NRZI data stream and a phase-locked loop clock signal. For each data transition in the received data stream, the phase detector produces proportional phase error information in the form of two pulse signals PD1 and PD2. Pulse signal PD1 has a pulse width TW1 which corresponds to the amount and direction of any phase error between the data signal transition and the PLL clock signal. Pulse signal PD2 has a fixed width TW2 equal to half the period of the PLL clock signal. The phase detector also generates a recovered data signal and a recovered clock signal using identical parallel circuits so that the recovered signals are time synchronized. Furthermore, the recovered data signal is derived from signals in the phase error detection path, eliminating the need for two distinct circuits for data recovery and clock recovery. In the preferred embodiment, the pulse signals from one positive and one negative data transition are integrated or averaged so as to eliminate problems associated with any duty cycle distortion and/or jitter in the incoming data stream. The sign and magnitude of the difference in the widths of the averaged pulse signals are proportional to the average phase error between the incoming data signal and the PLL clock signal.

14 Claims, 7 Drawing Sheets

PHASE DETECTOR FOR VERY HIGH FREQUENCY CLOCK AND DATA RECOVERY CIRCUITS

This application is a continuation of application Ser. No. 07/730,228, filed Jul. 15, 1991, now abandoned.

The present invention relates generally to phase detectors used in very high frequency (e.g., greater than 50 MHz) phase-locked loops, and particularly to phase detectors used in clock and data recovery circuits for NRZ (non-return to zero) and NRZI (non-return to zero inverted) data streams.

BACKGROUND OF THE INVENTION

As is well known to those skilled in the art of designing digital data signal receivers, it is common in such receivers to use a phase-locked loop (PLL) to synchronize the receiver's internal clock with the "carrier frequency" of the incoming signal. The clock signal generated by the PLL is herein called the "recovered clock". An essential function of a clock and data recovery circuit is the recovery of the clock signal from the incoming data transitions such that the recovered clock is able to sample the incoming data at the optimum positions (centers) of the data symbols.

In many data communication systems, data is transmitted using NRZ (non-return to zero) or NRZI (non-return to zero inverted) data coding, because such coding is efficient in bandwidth. In the NRZ coding scheme, a "1" bit is transmitted by a bit frame with a logic high voltage for the entire bit frame, and a "0" bit is transmitted by a bit frame with a logic low voltage for the entire bit frame. In the NRZI coding scheme, a "0" bit is transmitted by a bit frame in which there is no signal transition, and a "1" is transmitted by a bit frame in which there is a signal transition. In both the NRZ and NRZI coding schemes, data signals have no spectral component at the clock frequency. In both coding schemes, the data stream may have no signal transitions for several successive bit frames, which creates difficulties for many prior art phase detectors.

If several bit frames are overlaid on an oscilloscope screen, a pattern known as the "eye opening" is formed. Within each bit frame, the signal value must be sampled in order to decode the bit value for that frame. While sampling in the center of each bit frame is the ideal, circuit delays and other signal distortions may make it extremely difficult for the PLL to precisely track the bit frame center.

One prevalent problem found in many prior art phase detectors used in NRZ data recovery circuits is the "delay mismatch problem". As shown in FIG. 1, such prior art phase detectors (e.g., multiplier or exclusive-OR phase detectors) require that a non-linear element (such as a squaring device) be placed before the phase detector in order to reproduce the spectral component of the input data signal's clock frequency. A primary problem with this scheme is that data signals in the data recovery signal path must be delayed by the same amount of time as the signals which go through the non-linear element used for clock recovery. Any mismatch between these two distinct circuits (i.e., the non-linear device and a delay matching circuit) will cause mis-alignment of the recovered clock from the optimum sampling point, resulting in static alignment errors (SAE) and a higher chance of data decoding error.

As will be shown below, the present invention overcomes the delay mismatch problem by eliminating the need for separate signal paths for data recovery and clock recovery, as well as using identical circuits, with virtually identical delay, for both data and clock signals.

Another problem addressed by the present invention concerns "duty-cycle distortion". In very high speed optical data communications, such as Fiber Distribution Data Interface (FDDI) systems, the incoming data may contain large duty-cycle distortions (DCD), and data pattern dependent jitters (DDJ). DCD is characterized by positive going transitions and/or negative going transitions of the data signal being shifted from their ideal position within each bit frame. For a simple analogy, DDJ can be considered to generate similar effects as DCD, in that it dynamically changes the eye opening in which the signal can be sampled accurately.

In order to accurately decode the incoming data stream, and to maintain acceptable bit error rates even when the data stream contains duty cycle distortions or data pattern dependent jitters, it is preferable for the phase detector to provide "proportional phase error information" to the PLL so that the PLL can locate the statistical center of the eye opening.

For incoming NRZ or NRZI data streams with heavy duty-cycle distortions, there exist large differences between the phase-error information generated by positive and negative data transitions. As a result, conventional edge-triggered phase detectors require two phase detectors for phase error averaging: one for sensing positive transitions and one for sensing negative transitions. Delay mismatch between the clock recovery and data recovery signal paths is still a serious problem. Moreover edge-triggered phase detectors are intolerant to input signal glitches.

Another prior art phase detector, known as a "quantized phase sampler" circuit, samples an incoming NRZ data stream at two times the clock frequency and hunts for data transitions to provide phase error information. There is no delay mismatch problem because the recovered data is derived from the phase error sampling path. However, due to the edge-hunting nature of the circuit, there is no proportional phase-error information for the circuit to locate the center of the eye-opening when the incoming data stream contains severe DCD/DDJ distortions, causing the recovered clock to wander.

It is an object of the present invention to provide a phase detector that overcomes the problems with prior art phase detectors mentioned above.

SUMMARY OF THE INVENTION

In summary, the present invention is a phase detector circuit for use in very high frequency NRZ or NRZI clock and data recovery circuits. The phase detector circuit receives an incoming NRZI data stream and a phase-locked loop clock signal. For each data transition in the received data stream, the phase detector produces proportional phase error information in the form of two pulse signals PD1 and PD2. Pulse signal PD1 has a pulse width TW1 which corresponds to the amount and direction of any phase error between the data signal transition and the PLL clock signal. Pulse signal PD2 has a fixed width TW2 equal to half the period of the PLL clock signal. Together, the pulse widths of these two pulse signals indicate the phase error (if any) between the incoming data signal and the PLL clock signal. The frequency of the PLL clock is increased or decreased in accordance with the quantity TW1−TW2 so as to maintain phase lock.

In the preferred embodiment, the PD1 and PD2 pulse signals from a pair of adjacent positive and negative data transitions are integrated or averaged. The phase detector provides averaged proportionate phase error information for the PLL to locate the statistical center of the "eye opening", even when the incoming data stream contains severe duty cycle distortion and/or data dependent jitter. The average difference in the widths of the pulse signals is proportional to the average phase error between the incoming data signal and the PLL clock signal.

Most importantly, the phase detector circuit uses identical circuit elements, with virtually no delay mismatch, to generate a recovered data signal RXD and a recovered clock signal RXC. Furthermore, the recovered data signal is derived from signals in the phase error detection path, eliminating the need for two distinct circuits for data recovery and clock recovery. Thus, the "delay mismatch" problem associated with prior art phase detectors in NRZ data recovery circuits is virtually eliminated.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 2:
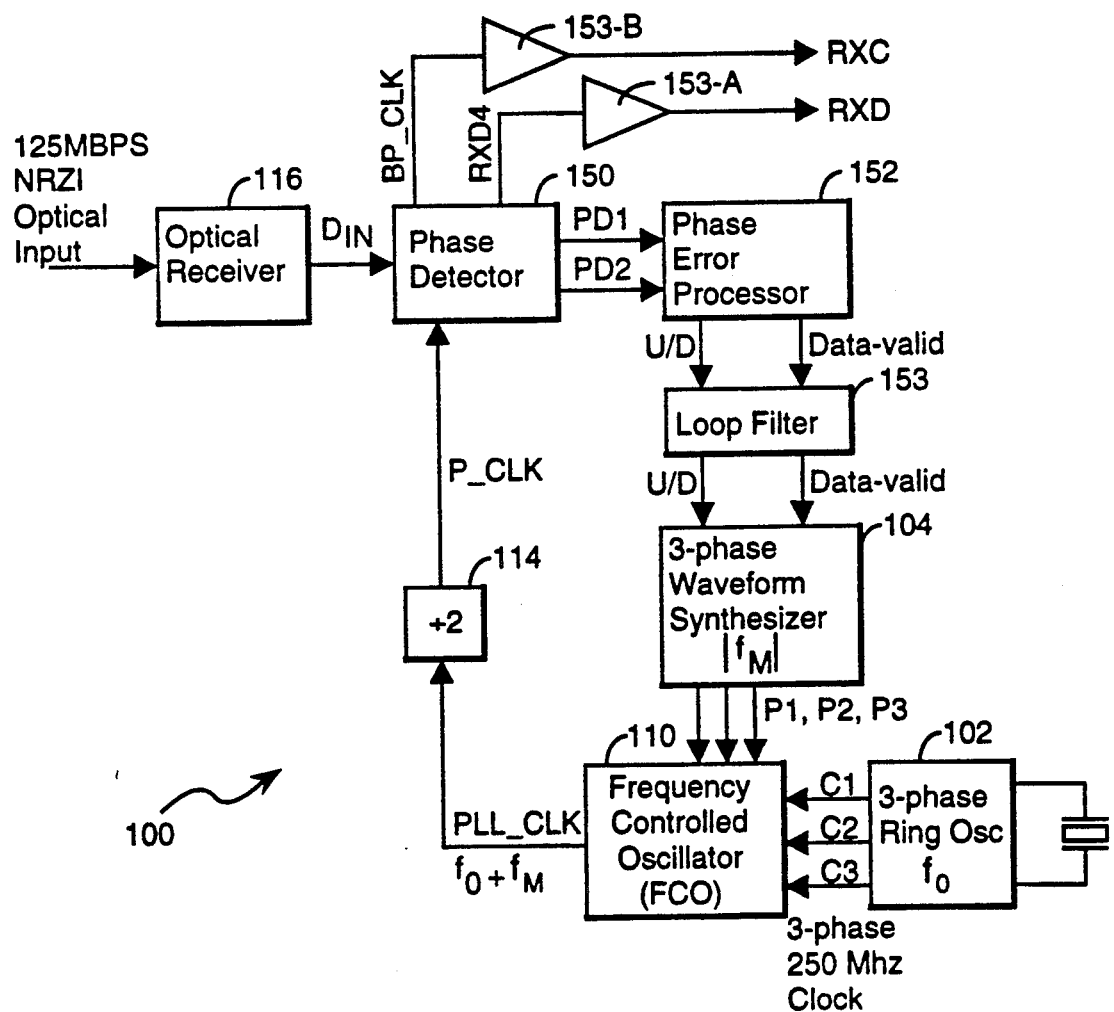
FIG. 2 is a block diagram of a phase-locked loop circuit incorporating a phase detector designed in accordance with the present invention.

Referring to FIG. 2, there is shown a high frequency, clock/data recovery phase-locked loop (PLL) 100. The function of the PLL 100 is to generate a periodic clock signal P_CLK which matches the frequency and phase of an incoming 125 megabit per second data signal $D_{IN}$. In the preferred embodiment, the data signal $D_{IN}$ is a NRZI coded data signal.

The primary components of the PLL 100 are as follows. A three-stage ring oscillator 102, generates three equally phase spaced high frequency clock signals C1 to C3 having a frequency $f_0$ of about 250 megahertz. A waveform synthesizer 104 (also called a Digital Signed Phase-to-Frequency Converter), generates three equally phase spaced low frequency control signals having frequency $|f_M|$, where $f_M$ corresponds to the frequency error between the data signal $D_{IN}$ and $f_0$. More precisely, frequency $f_M$ is set by the PLL 100 to be approximately equal to $2f_{IN}-f_0$, where $f_{IN}$ is the clock frequency of the incoming data signal $D_{IN}$. In the preferred embodiment, the waveform synthesizer 104 is a low cost triangular wave digital synthesizer which generates triangular waveforms. Waveform synthesizer 104 is described more completely in application Ser. No. 07/681,095 filed Apr. 5, 1991.

A frequency controlled oscillator (FCO) 110 generates a clock signal PLL_CLK whose frequency is equal to $f_0+f_M$, where $f_M$ is positive or negative in accordance with the sign of the quantity $2f_{IN}-f_0$. The PLL_CLK clock signal is divided by two by circuit 114 to generate the P_CLK signal, which is a squarewave signal that should match the frequency $f_{IN}$ (of about 125 MHz) and phase of the data signal $D_{IN}$. FCO 110 is described more completely in application Ser. No. 07/703,404, filed May 21, 1991, issued as U.S. Pat. No. 5,132,633 on Jul. 21, 1992.

Phase error detector 150 continually compares the phase of the P_CLK clock signal with the phase of the input signal $D_{IN}$. The phase detector 150 generates a phase error signal having two components, PD1 and PD2. PD1 and PD2 are processed by a phase error processing circuit 152 to produce up/down frequency adjustment signals U/D and DATA-VALID. After being filtered by a digital loop filter 153, these frequency adjustment signals are used to adjust the frequency $f_M$ of the control signals generated by the waveform synthesizer 104.

The phase detector 150 uses identical circuit elements, with virtually no delay mismatch, to ensure sampling of incoming data at the optimum point. In addition to phase error information, the phase detector also generates a recovered data signal RXD4 and a recovered clock signal BP_CLK, replicated as signals RXD and RXC, respectively, by buffer circuits 153-A and 153-B.

THE PREFERRED PHASE DETECTOR CIRCUIT

Figure 3:
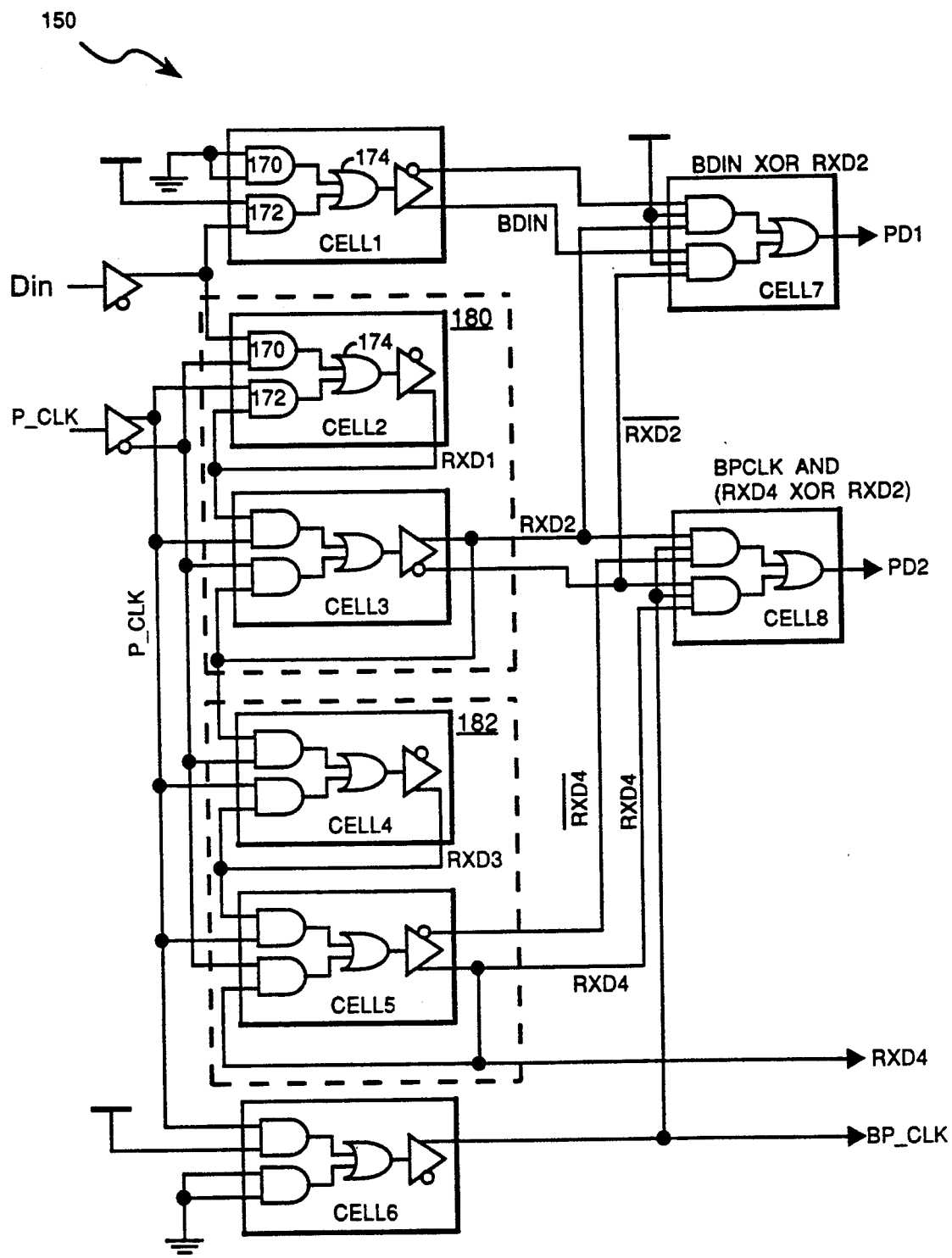
FIG. 3 is a logic-level diagram of a preferred embodiment of the phase detector of the present invention.

Referring to FIG. 3, the phase detector 150 comprises eight cells, herein labelled CELL1 through CELL8. CELL1 through CELL6 are identical AND/OR circuits, and thus the signal delay T1-T6 through each of these cells is virtually identical. CELL7 and CELL8 are identical AND/OR circuits (connected to perform XOR functions) with virtually identical signal delays T7-T8.

Each of the eight cells contains two AND gates 170-172, with their outputs connected to the inputs of an OR gate 174. The AND gates in CELL1 through CELL6 each have two inputs, while the AND gates in CELL7 and CELL8 each have three inputs.

CELL1 is used as a one cell delay for the data signal $D_{IN}$ whose output is labelled BDIN, and CELL6 is used as a one cell delay for the phase-locked loop clock P_CLK whose output is labelled BP_CLK.

CELL2 through CELL5 are connected as transparent latches. More particularly, CELL2 and CELL3 together form a master-slave D flip-flop 180 that is used to latch the incoming data signal $D_{IN}$ for one clock cycle, with the latched data signal output by the circuit being labelled RXD2. CELL4 and CELL5 form a second master-slave D flip-flop 182 that is used to latch the RXD2 data signal for one clock cycle, with the signal output by the circuit being labelled RXD4.

Figure 4:
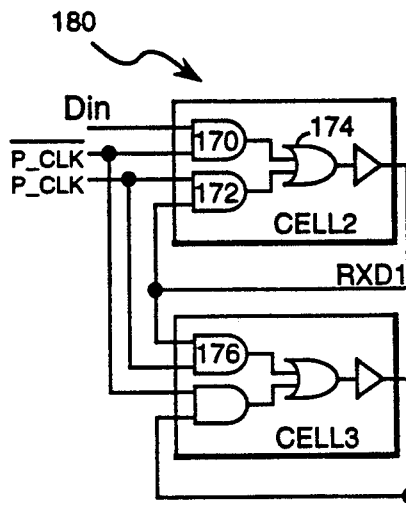
FIG. 4 depicts a master-slave D flip-flop circuit used in the preferred embodiment.
Figure 5:
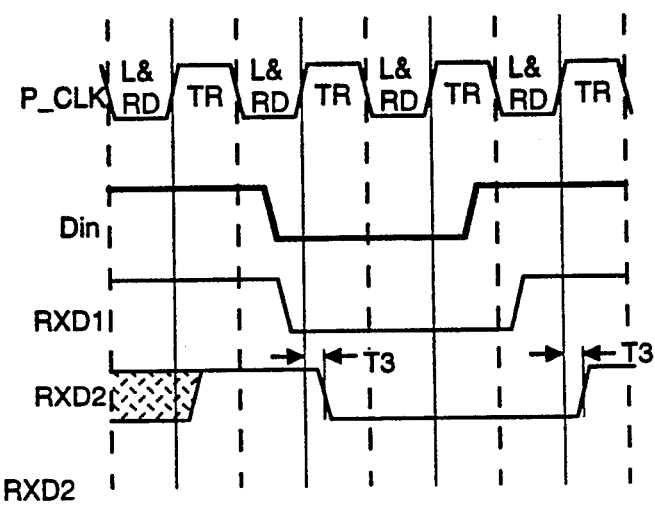
FIG. 5 is a timing diagram depicting the operation of the circuit in FIG. 4.

Referring to FIGS. 4 and 5, the operation of flip-flop 180 is as follows. When P_CLK is low (see FIG. 5) the current value of $D_{IN}$ is read by AND gate 170 and transferred by OR gate 174 to RXD1. When P_CLK goes high, the latched data value (RXD1) is transferred to RXD2 via AND gate 176 in CELL3. Furthermore, the current value of RXD1 is fed back through AND gate 172 in CELL2 so as to hold the latched value. During the next half-clock cycle when P_CLK is low, a similar feed-back path is used to maintain the value of RXD2. Thus, in summary, while P_CLK is low, a new $D_{IN}$ data value is read into CELL2, while the previously latched data value is held by CELL3. When P_CLK goes high, the RXD1 signal from CELL2 is transferred to CELL3, appearing at RXD2 after a delay T3 associated with CELL3. Thus, CELL2 and CELL3 behave as a master-slave D flip-flop with a "clock to Q" delay of T3. FIG. 5 shows the flow of data through the flip-flop 180 for both a negative and a positive transition of $D_{IN}$.

Referring back to FIG. 3, flip-flop 180 samples and captures the $D_{IN}$ signal. Flip-flop 182 samples and stores the output of flip-flop 180 at the next clock cycle, much like the next bit in a shift register. Thus, each time that there is a data transition in the incoming data stream, the transition is reflected at RXD2 after P_CLK goes high, and the outputs RXD2 and RXD4 of the two flip-flops 180 and 182 differ for one clock cycle.

CELL7 generates the exclusive-OR of the BDIN and RXD2 signals, with the resulting signal being called PD1. Ideally, when there is no phase error (i.e., when data transitions occur at the falling edge of P_CLK), each transition in the data signal $D_{IN}$ should occur one-half clock cycle before it is reflected in the RXD2 signal, resulting in a PD1 pulse with a width TW1 of one-half clock cycle. If there is a phase error such that data transitions in $D_{IN}$ lead or lag the falling edge of P_CLK, then the PD1 pulse will be longer or shorter than one-half clock cycle, respectively.

Figure 6:
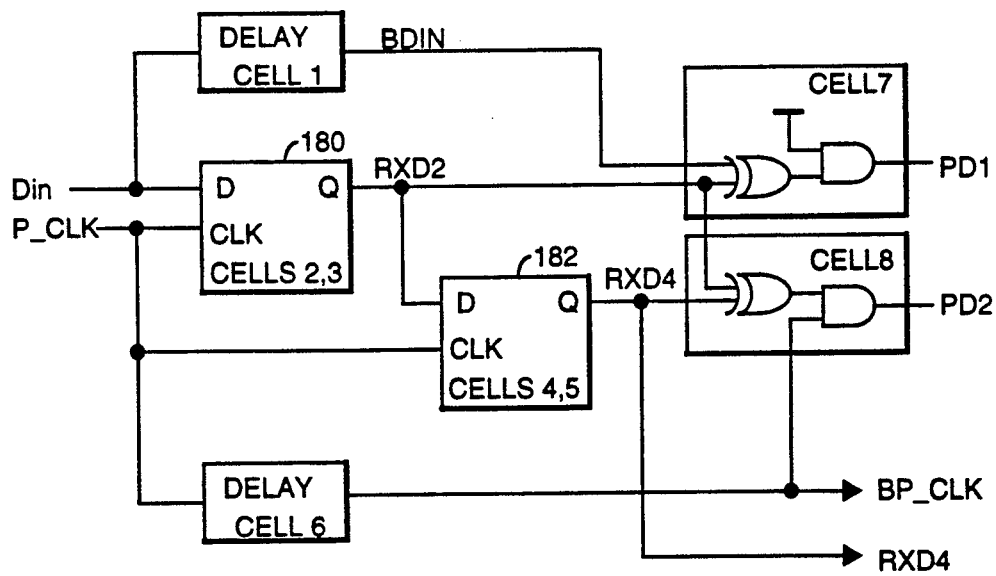
FIG. 6 is a simplified schematic diagram of a circuit that is logically equivalent to the circuit of FIG. 3.

CELL8 generates the exclusive-OR of "RXD2 AND BP_CLK" and "RXD4 AND BP_CLK" with the resulting signal being called PD2. Thus, when RXD2 and RXD4 are not equal, the delayed clock signal BP_CLK is allowed to pass through CELL8, with a fixed pulse width TW2 that is equal to half the BP_CLK clock period. FIG. 6 shows a circuit that is the logical equivalent of the phase detector circuit 150 shown in FIG. 3. The propagation delays T1-T6 of CELL1 through CELL6 are approximately equal, as are the propagation delays T7-T8 of CELL7 through CELL8. More importantly, in the part of the phase detector circuit which measures phase error, identical circuit elements are used to ensure that the gate delay for $D_{IN}$ and P_CLK are equal to the "clock to Q" delay at RXD2 as well as RXD4 such that at zero phase error, the pulse width TW1 equals the pulse width TW2, which is half the P_CLK period. This arrangement ensures that P_CLK samples $D_{IN}$ at about the center of the data symbol.

The use of identical circuit cells in the present invention also ensures fidelity in the PD1 and PD2 pulse widths. Furthermore, by using a common signal path for both recovered data and phase error generation, the phase detector of the present invention minimizes static alignment errors (SAE). The "delay mismatch" problem associated with prior art phase detectors in NRZ data recovery circuits is virtually eliminated.

Figure 7:
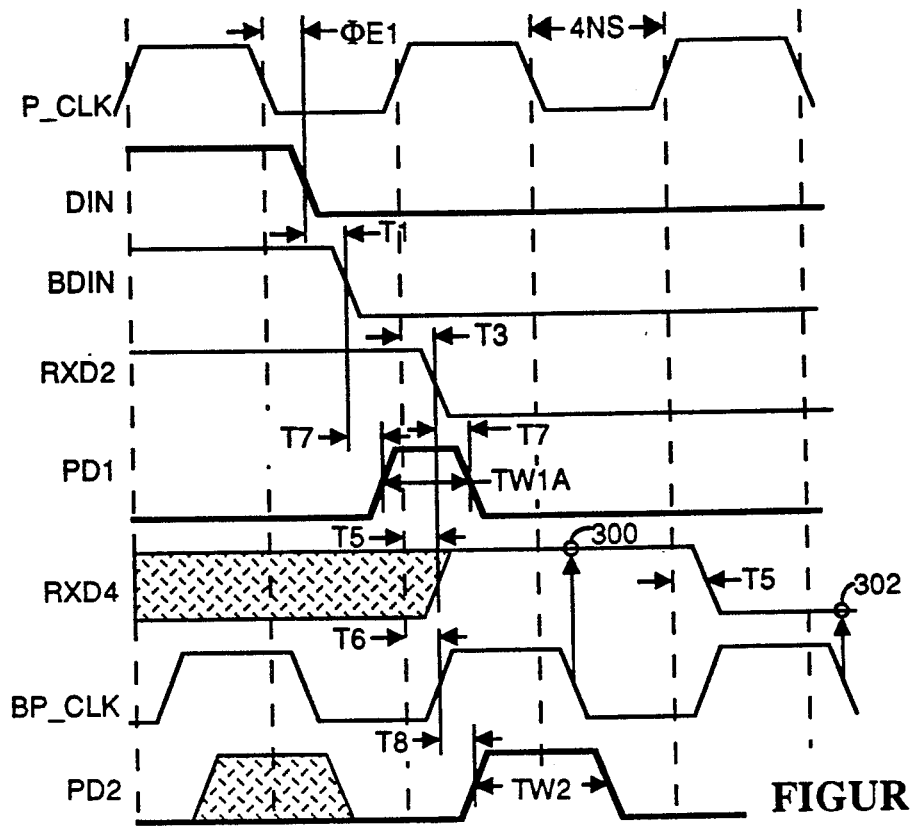
FIGS. 7 through 10 are timing diagrams depicting the operation of the circuit in FIG. 3.
Figure 8:
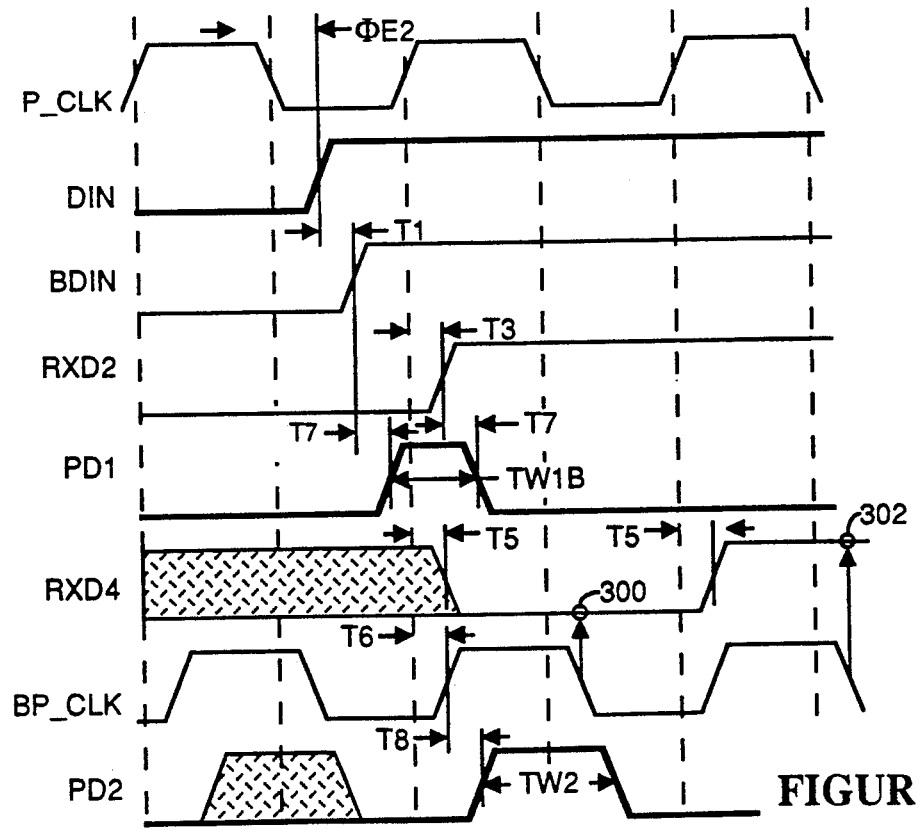

FIGS. 7 and 8 are timing diagrams of the operation of phase detector 150 for negative and positive data transitions, respectively, which represent logic "1" symbols for NRZI data. The phase error for the negative data signal transition is denoted ΦE1 and the phase error for the positive data signal transition is denoted ΦE2. Each half-cycle of the P_CLK signal has a duration of four nanoseconds (assuming that P_CLK is running at 125 MHz).

Delays associated with the cells shown in FIG. 3 are shown in these figures by time values T1 to T8. The width of each PD2 pulse is one-half clock cycle, shown as TW2. The width of each PD1 pulse, which varies in accordance with phase error between the data signal $D_{IN}$ and the clock signal P_CLK, is shown as TW1A and TW1B (for negative and positive data transitions, respectively).

As an illustration, in FIGS. 7 and 8 ΦE1 is equal to 1.2 nanoseconds and ΦE2 is equal to 1.4 nanoseconds. If the cells have equal delays of about one nanosecond, TW1A is equal to about 2.8 nanoseconds, TW1B is equal to about 2.6 nanoseconds, and TW2 is equal to about 4.0 nanoseconds.

As can be seen, RXD2 follows transitions in $D_{IN}$ with a delay of T3 after the next positive transition of P_CLK. RXD4 follows RXD2 a full clock cycle later. Thus, the delay from $D_{IN}$ to RXD4 is about one and half clock cycles. Recovered NRZI data signal RXD4 should be sampled at each negative transition of the recovered clock signal BP_CLK, such as points 300 and 302.

Ideally, each transition in the data signal $D_{IN}$ should occur simultaneously with the negative transition of P_CLK. If there is a phase error such that data transitions in the data signal $D_{IN}$ either leads or lags the negative transition during the P_CLK clock cycle, then the PD1 pulse will be either longer or shorter than one-half clock cycle. In the examples shown in FIGS. 7 and 8, the data signal lags the P_CLK negative transition, which means that clock is running a little too fast. As a result, the PD1 pulse is shorter than the PD2 pulse by an amount that is proportional to the phase error. When this phase error information is processed, the PLL's clock rate will be decreased slightly, causing the edges of the P_CLK signal to catch up to the transitions in the $D_{IN}$ signal. Note that when a transition in the data signal leads the P_CLK negative transition, which means that clock is running a little too slow, the PD1 pulse will be longer than the PD2 pulse by an amount that is proportional to the phase error.

Figure 1:
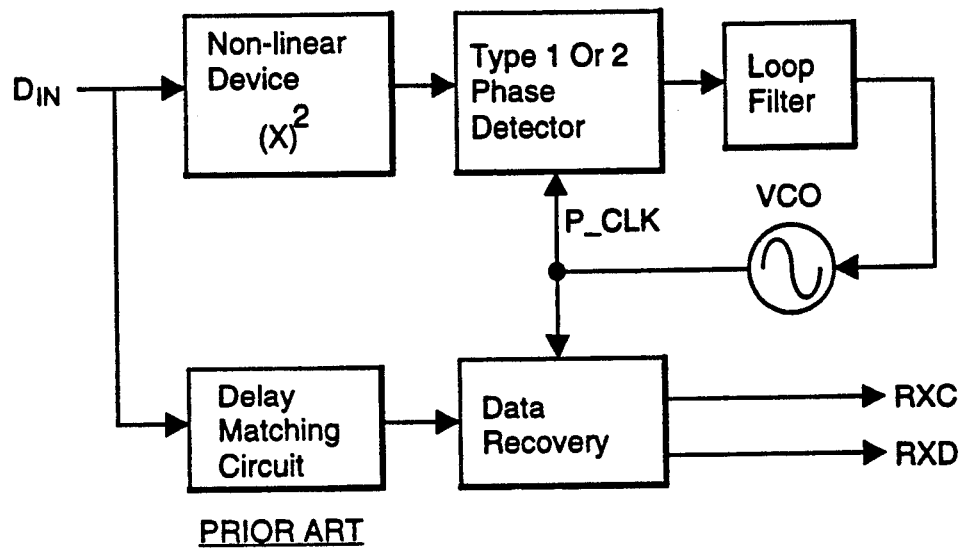
FIG. 1 is a block diagram of a prior art phase detector circuit.
Figure 9:
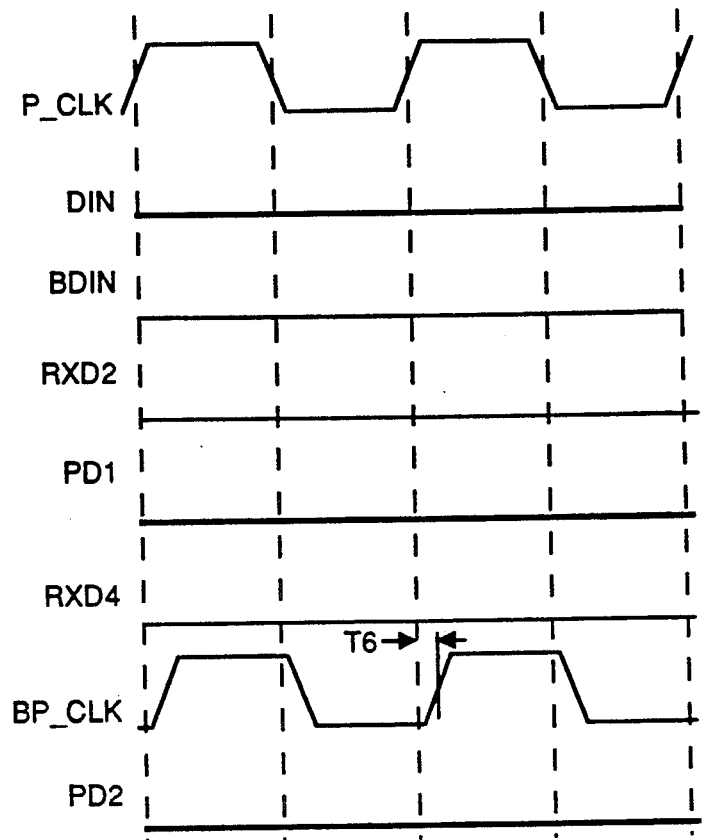
Figure 10:
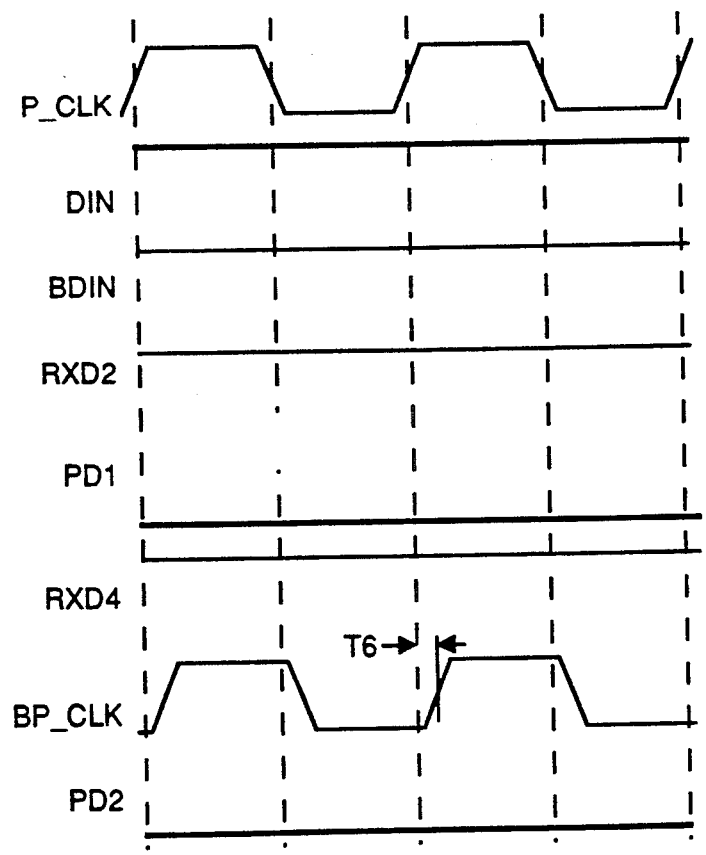

FIGS. 9 and 10 show two possible cases of a data stream representing logic "0" symbols for NRZI data. These figures show that no PD1 and PD2 pulses are generated when there are no transitions in the data stream $D_{IN}$. The frequency of the clock signal P_CLK generated by the FCO (see FIG. 1) is left unchanged.

Figure 11:
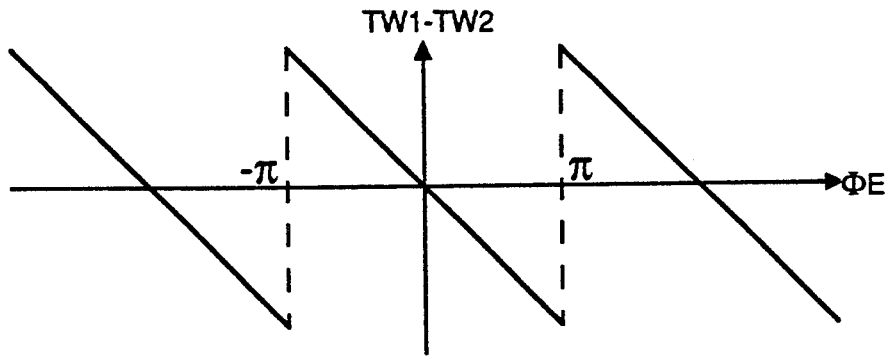
FIG. 11 shows the phase detector's transfer characteristics.

FIG. 11 shows the phase detector's transfer characteristics. As shown, the transfer function is linear over the range $-\pi$ to $+\pi$, as represented by the equation $$\Phi E = K(TW1 - TW2)$$

where K is a constant having unit dimensions of radians per second. For $D_{IN}$ at 125 MHz, $K = 2\pi$ radian/8 nanosecond.

For NRZ and NRZI data streams, a positive data transition must always be followed by a negative data transition, and vice versa. Over a period of time, the phase error can be described by the following equations:

$$\Phi E1 = K(TW1A - TW2)$$

$$\Phi E2 = K(TW1B - TW2).$$

The average phase error $\Phi E(AVG)$ over N pairs of adjacent positive and negative data transitions is given by $$\Phi E(AVG) = \frac{1}{N} \sum_{i=1}^{N} (\Phi E1_i + \Phi E2_i)$$

$$\Phi E(AVG) = \frac{1}{N} \sum_{i=1}^{N} K(TW1A_i + TW1B_i - 2TW2)$$

Figure 12:
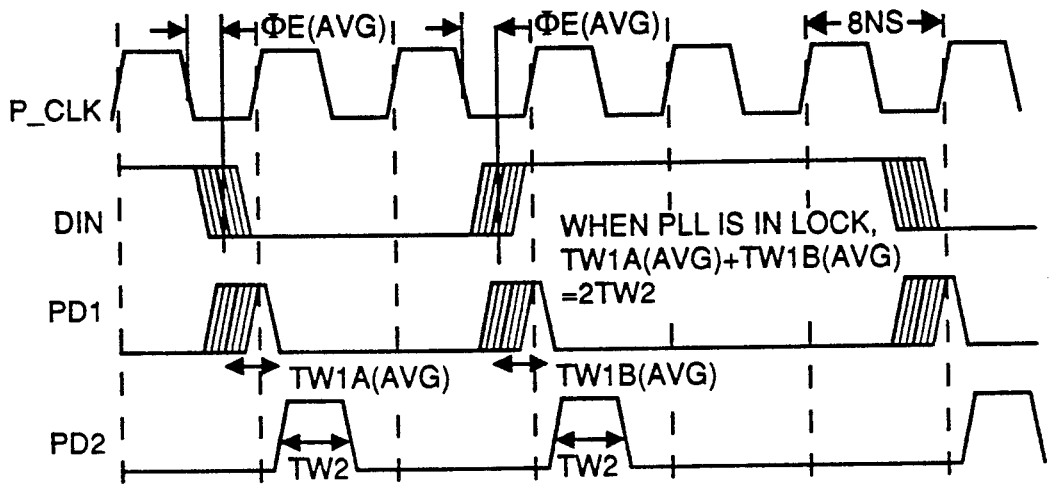
FIG. 12 is a phase detector timing diagram for an NRZI data stream with jitters.

FIG. 12 shows the timing diagram of the phase detector for an NRZI data stream at $D_{IN}$ with jitters. The phase error information generated by the phase detector causes the PLL to adjust the phase of its clock P_CLK so that the average of TW1A+TW1B equals 2TW2. In other words, P_CLK will be phase-locked to the statistical mean of the jitters such that the phase error $\Phi E$, on average, equals zero.

Figure 13:
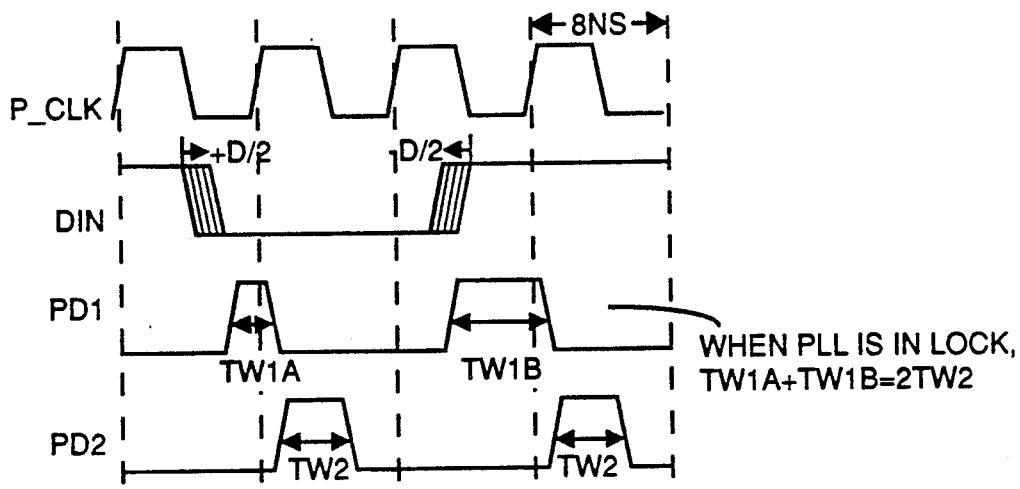
FIG. 13 is a phase detector timing diagram for an NRZI data stream with duty cycle distortion.

FIG. 13 shows the timing diagram of the phase detector with an NRZI data stream at $D_{IN}$ with duty cycle distortion. The pulse widths TW1A for one type of transition (e.g., negative transitions) will be shortened by approximately the same amount D/2 that the pulse widths TW1B are lengthened for the opposite type of transition (e.g., positive transitions). As explained below, the phase error processor 152 of the present invention averages the phase error of adjacent positive and negative transitions and thereby enables the PLL to be locked to the statistical center of the "eye opening".

The use of identical circuit cells in the present invention, shown in FIG. 3, ensures minimum distortion in the PD1 and PD2 pulse widths. In particular, identical circuit elements in CELL1, CELL3, CELL5 and CELL6 ensure that both TW1 and TW2 equal one half of the P_CLK clock cycle when the PLL is locked virtually at the optimum center of the eye-opening.

Note that for small phase error, the pulse width of PD1 does not approach zero, but rather approaches that of PD2, which is equal one half of the P_CLK clock cycle (e.g., 4 nanoseconds for a 125 MHz data signal). This arrangement provides sufficient pulse width for downstream logic gates, avoiding the dead-band problem associated with some prior art phase detectors that generate a pulse signal with zero pulse width when there is no phase error. Furthermore, the phase error information generated by the present invention is self contained in that it already includes a reference value (i.e., the width of PD2) for locking. These characteristics of the PD1 and PD2 signals make the phase detector 150 robust and easy to work with.

INTERPRETATION AND PROCESSING OF THE PD1 AND PD2 PHASE ERROR SIGNALS

Figure 14:
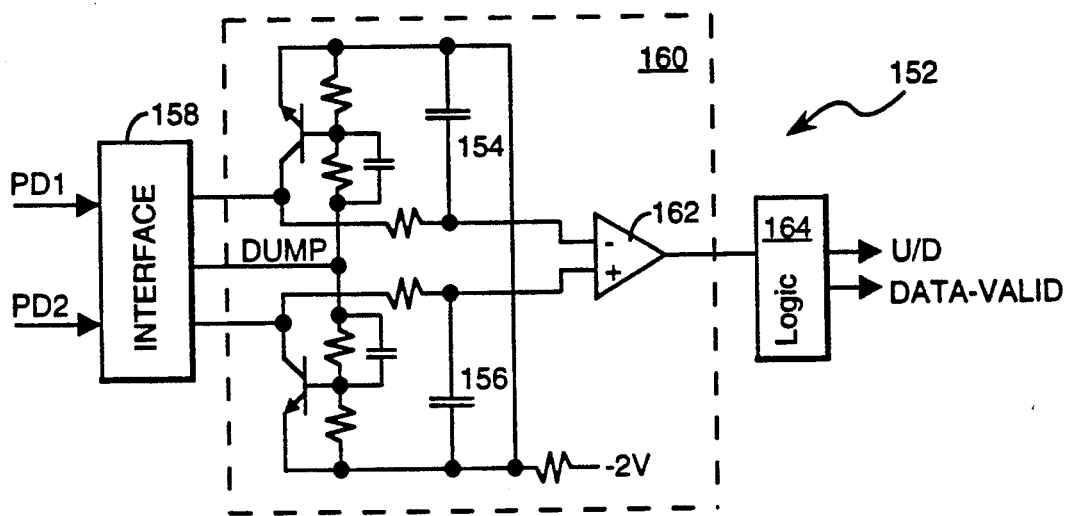
FIG. 14 is a block diagram of a phase error processing circuit which processes the proportionate phase error information generated by the phase detector in FIG. 2.

Referring to FIGS. 2 and 14, the phase error processor 152 is used to process the PD1 and PD2 pulse signals from the phase detector 150. During each period of forty-four clock periods (approximately 352 nanoseconds), interface 158 allows the phase error information from two successive data transitions to propagate to the phase error integrator 160. While that information is being processed, the interface 158 blocks any further phase information from being applied to the integrator 160. The pulse widths of the PD1 and PD2 signals are integrated (or averaged) on two capacitors, 154 and 156. The accumulated voltages on the two capacitors due to the two successive PD1 and PD2 pulses correspond to the averaged phase error of the adjacent positive and negative data transitions.

Comparator 162 determines the sign of the difference between the two integrated voltages, which indicates the sign of the average phase error due to successive positive and negative data transitions. The output of the comparator 162 is a logic signal U/D (up/down) that instructs the waveform synthesizer and the FCO to either increase or decrease the frequency of the phase-locked clock P_CLK.

After the phase error information from a pair of data transitions has been processed, interface 158 discharges the two integrating capacitors 154 and 156, and then the PD1 and PD2 phase error information from another pair of data transitions is processed in the next time frame.

When the density of data transitions during the forty-four clock period time frame is less than expected (for FDDI, the minimum edge density is one transition per ten clock periods) logic circuit 164 in, the phase error processor 152 disables its "Data-Valid" output signal so as to prevent unnecessary dithering of the phase-locked clock. The Data-Valid signal is enabled only when the processor 152 is ready to adjust the frequency of the phase-locked loop. When Data-Valid is off, the frequency of the phase-locked loop is held at its current setting.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims. For instance, while the preferred embodiment of the present invention is designed for data and clock recovery of NRZ and NRZI data streams, with minor modification the present invention can also be used for recovering other types of data streams.

What is claimed is:

1. A phase error detector for use in a data recovery circuit which receives a data signal and a clock signal, comprising:

means for receiving a data signal and for receiving a cyclic clock signal that has positive and negative transitions at predefined times in each cycle of said clock signal;

a first pulse generator circuit, coupled to said receiving means, which generates a first pulse signal whenever said data signal changes value; said first pulse signal beginning at a time corresponding to said data signal value change and ending at a time corresponding to a predefined one of said transitions of said clock signal; said first pulse signal having a pulse width TW1 that corresponds to the amount of time between said data signal's value change and said predefined one of said transitions of said clock signal; and a second pulse generator circuit, coupled to said receiving means, which generates a second pulse signal whenever said data signal changes value, said second pulse signal having a width TW2 that corresponds to a predefined portion of said clock signal cycle;

wherein said first pulse generator circuit and said second pulse generator circuit are substantially identical circuits so that pulse signal generation delays in said first pulse generator circuit are equal to pulse signal generation delays in said second pulse generator circuit;

wherein the average pulse width of said first pulse signal is equal to the pulse width of said second pulse signal when there is no phase error between said data signal and said clock signal, and wherein the difference in the pulse widths of said first and said second pulse signals is proportional to the phase error between said data signal and said clock signal.

2. The phase error detector of claim 1, further including processing means, coupled to said first and second pulse generator circuits, for comparing pulse widths of said first and second pulse signals and generating a phase error signal corresponding to TW1-TW2, the difference between the pulse widths of said first and second pulse signal.

3. The phase error detector of claim 2, said processing means including first integrating means for integrating a plurality of first pulse signals, second integrating means for integrating a corresponding plurality of second pulse signals, and comparison means coupled to said first and second integrating means, for generating a phase error signal corresponding to the difference between said integrated first and second pulse signals.

4. The phase error detector of claim 2, said data signal having alternating positive and negative transitions; said processing means including
 first integrating means for integrating at least two successive ones of first pulse signals, corresponding to successive positive and negative transitions in said data signal;
 second integrating means for integrating successive ones of second pulse signals corresponding to the first pulse signals integrated by said first integrating means; and
 comparison means, coupled to said first and second integrating means, for generating a phase error signal corresponding to the difference between said integrated first and second pulse signals.

5. The phase error detector of claim 1, wherein said second pulse signal is a reference signal which always has a pulse width of about one-half of said clock signal cycle.

6. A phase error detector for use in a data recovery circuit which receives a data signal and a synthesized clock signal, comprising:
 a data delay circuit which receives a data signal and generates a first delayed data signal after a propagation delay;
 a latch circuit which receives a cyclic clock signal that has positive and negative transitions at predefined times in each cycle of said clock signal, said latch circuit including a first sub-circuit that stores said data signal at a predefined time in each cycle of said clock signal, and a second sub-circuit that generates a second delayed data signal corresponding to said stored data signal after a predefined transition in said clock signal; wherein said data delay circuit and said second sub-circuit are identical circuits so that propagation delay of said data signal through said data delay circuit is equal to propagation delay of said stored data signal through said second sub-circuit; and
 an exclusive-OR circuit, coupled to said data delay and latch circuits, which generates a first pulse signal whenever said first delayed data signal and said second delayed data signal are not equal; said first pulse signal having a width that corresponds to phase error between said data signal and said clock signal.

7. A phase error detector for use in a data recovery circuit which receives a data signal and a synthesized clock signal, comprising:
 a data delay circuit which receives a data signal and generates a first delayed data signal after a propagation delay;
 a latch circuit which receives a cyclic clock signal that has positive and negative transitions at predefined times in each cycle of said clock signal, said latch circuit including a first sub-circuit that stores said data signal at a predefined time in each cycle of said clock signal, and a second sub-circuit that generates a second delayed data signal corresponding to said stored data signal after a predefined transition in said clock signal; wherein said data delay circuit and said second sub-circuit are identical circuits so that propagation delay of said data signal through said data delay circuit is equal to propagation delay of said stored data signal through said second sub-circuit;
 a first exclusive-OR circuit, coupled to said data delay and latch circuits, which generates a first pulse signal whenever said first delayed data signal and said second delayed data signal are not equal; said first pulse signal having a pulse width TW1 that corresponds to phase error between said data signal and said clock signal; and
 a reference pulse generator coupled to said latch circuit, which receives said clock signal and generates a second pulse signal whenever said data signal changes value, said second pulse signal having a pulse width TW2 that corresponds to a predefined portion of said clock signal cycle;
 wherein the phase error, if any, between said data signal and said clock signal is proportional to the difference, TW1−TW2, between the pulse widths of the first and second pulse signals.

8. The phase error detector of claim 7, further including processing means, coupled to said first exclusive-OR circuit and said reference pulse generator circuit, for comparing pulse widths of said first and second pulse signals and generating a phase error signal corresponding to TW1−TW2, the difference between the pulse widths of said first and second pulse signals.

9. The phase error detector of claim 8, said processing means including first integrating means for integrating a plurality of first pulse signals, second integrating means for integrating a corresponding plurality of second pulse signals, and comparison means coupled to said first and second integrating means, for generating a phase error signal corresponding to the difference between said integrated first and second pulse signals.

10. The phase error detector of claim 8, said data signal having alternating positive and negative transitions;
 said processing means including first integrating means for integrating at least two successive ones of first pulse signals, corresponding to successive positive and negative transitions in said data signal;

second integrating means for integrating successive ones of second pulse signals corresponding to the first pulse signals integrated by said first integrating means; and comparison means, coupled to said first and second integrating means, for generating a phase error signal corresponding to the difference between said integrated first and second pulse signals.

11. The phase error detector of claim 7, wherein
said first pulse signal has a pulse width equal to the amount of time between each transition in said data signal and said predefined transition in said clock signal; and the average pulse width of said first pulse signal is equal to the pulse width of said second pulse signal when there is no phase error between said data signal and said clock signal.

12. The phase error detector of claim 7, wherein
said second pulse signal is a reference signal which always has a pulse width of about one-half of said clock signal cycle, and said first pulse signal has an average pulse width that is equal to the pulse width of said second pulse signal when there is no phase error between said data signal and said clock signal.

13. The phase error detector of claim 7, wherein said reference pulse generator circuit includes:

a second latch circuit that regenerates said second delayed data signal with an additional delay of exactly one cycle of said clock signal;

a clock delay circuit which receives said clock signal and generates a delayed clock signal after a propagation delay equal to said data delay circuit's propagation delay; and a second exclusive-OR circuit, coupled to said latch circuit and second latch circuit, which receives said clock signal and generates said second pulse signal by regenerating said delayed clock signal whenever said regenerated second delayed data signal and said second delayed data signal are not equal.

14. The phase error detector of claim 13, wherein
said regenerated second delayed data signal and said delayed clock signal comprise a recovered data signal and a recovered clock signal which are synchronized, said recovered clock signal having positive and negative transitions at predefined times in each cycle of said recovered clock signal; each change in value of said recovered data signal being synchronized with a predefined one of said transitions of said recovered clock signal.

* * * * *